(12) United States Patent
Po et al.

(10) Patent No.: US 8,841,942 B2
(45) Date of Patent: Sep. 23, 2014

(54) VOLTAGE SWITCH CIRCUIT

(71) Applicant: eMemory Technology Inc., Hsin-Chu (TW)

(72) Inventors: Chen-Hao Po, Hsinchu (TW); Chiun-Chi Shen, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 14/133,924

(22) Filed: Dec. 19, 2013

(65) Prior Publication Data

US 2014/0103988 A1  Apr. 17, 2014

Related U.S. Application Data

(62) Division of application No. 13/423,411, filed on Mar. 19, 2012, now Pat. No. 8,653,878.

(30) Foreign Application Priority Data

Oct. 19, 2011 (TW) .............................. 100137944 A

(51) Int. Cl.
*H03K 3/00* (2006.01)

(52) U.S. Cl.
USPC ............................................ 327/108; 326/83

(58) Field of Classification Search
USPC ............................................. 327/108; 326/83
See application file for complete search history.

(56) References Cited

U.S. PATENT DOCUMENTS

| | | | |
|---|---|---|---|
| 6,639,427 B2 | 10/2003 | Dray et al. | |
| 6,642,769 B1 | 11/2003 | Chang et al. | |
| 6,803,788 B2 | 10/2004 | Amick et al. | |
| 6,906,552 B2 | 6/2005 | Ajit et al. | |
| 7,053,658 B1 | 5/2006 | Blankenship et al. | |
| 7,268,588 B2 | 9/2007 | Sanchez et al. | |
| 7,382,158 B2 | 6/2008 | Kimura et al. | |
| 7,388,403 B1 | 6/2008 | Yang et al. | |
| 7,446,564 B2 | 11/2008 | Huang et al. | |
| 7,501,856 B2 | 3/2009 | Huang et al. | |
| 8,310,296 B2 * | 11/2012 | Kuroda | 327/374 |
| 8,373,485 B2 | 2/2013 | Po et al. | |

FOREIGN PATENT DOCUMENTS

JP    2000513171    10/2000

* cited by examiner

*Primary Examiner* — Kenneth B. Wells
(74) *Attorney, Agent, or Firm* — WPAT, PC; Justin King

(57) ABSTRACT

A voltage switch circuit uses PMOS transistors to withstand high voltage stress. Consequently, the NMOS transistors are not subject to high voltage stress. The lightly-doped PMOS transistors are compatible with a logic circuit manufacturing process. Consequently, the voltage switch circuit may be produced by a logic circuit manufacturing process.

6 Claims, 5 Drawing Sheets

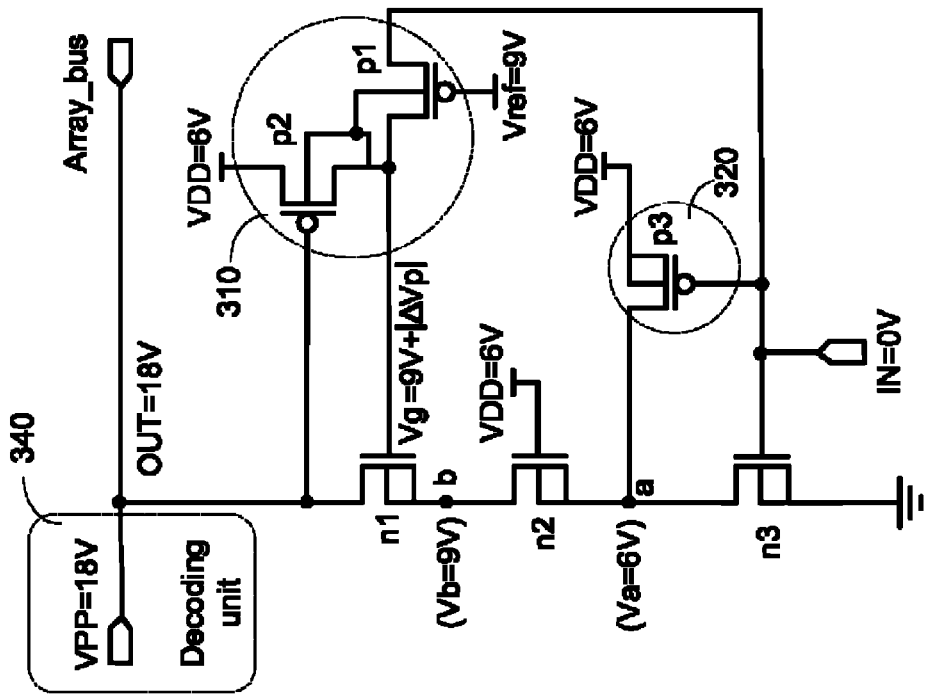
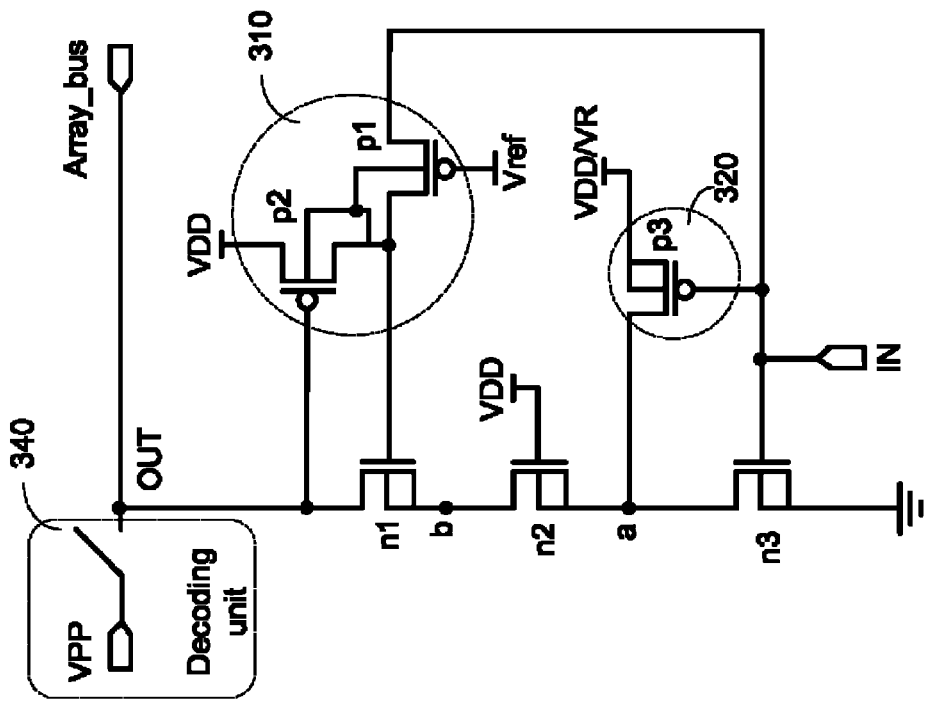

VOLTAGE SWITCH CIRCUIT

This is a divisional application of co-pending U.S. application Ser. No. 13/423,411, filed Mar. 19, 2012, which claims the benefit of Taiwan Patent Application No. 100137944, filed Oct. 19, 2011, the subject matters of which are incorporated herein by reference.

FIELD OF THE INVENTION

The present invention relates to a voltage switch circuit, and more particularly to a voltage switch circuit with PMOS transistors to withstand high voltage stress.

BACKGROUND OF THE INVENTION

FIG. 1 is a schematic circuit diagram illustrating a decoding circuit module for a memory according to the prior art. As shown in FIG. 1, the decoding circuit module comprises a high voltage (HV) decoding switch system 110 and a low voltage (LV) decoding switch system 150.

The HV decoding switch system 110 comprises a voltage switch circuit 120, a first voltage switch circuit module 130, and a decoding unit 140. According to a controlling signal EN, a first voltage HV or a second voltage MV is selectively outputted from the voltage switch circuit 120 to be used as an input voltage VPP of the decoding unit 140.

Moreover, the first voltage switch circuit module 130 comprises N voltage switch circuits. The configuration of each of the N voltage switch circuits of the first voltage switch circuit module 130 is similar to that of the voltage switch circuit 120. The first voltage switch circuit module 130 is controlled according to an N-bit address signal A<N−1:0>. Moreover, according to the N-bit address signal A<N−1:0>, an N-bit high voltage decoding signal HVDEC<N−1:0> is outputted from the first voltage switch circuit module 130 and inputted into the decoding unit 140.

For example, if the (N−1)-the bit address signal A[N−1] is at a low-level state (L), the (N−1)-the bit high voltage decoding signal HVDEC[N−1] is the first voltage HV. Whereas, if the (N−1)-th bit address signal A[N−1] is at a high-level state (H), the (N−1)-th bit high voltage decoding signal HVDEC[N−1] is the second voltage MV. The operations of other voltage switch circuits of the first voltage switch circuit module 130 are identical, and are not redundantly described herein.

After the input voltage VPP and the N-bit high voltage decoding signal HVDEC<N−1:0> are received by the decoding unit 140, different states (e.g. the on/off states) are generated in $2^N$ array bus signal lines Array_bus<$2^N$−1:0>. Since the decoding unit 140 is not the subject matter of the present invention, the circuitry and operating principles of the decoding unit 140 will not be illustrated herein.

Moreover, the LV decoding switch system 150 comprises a second voltage switch circuit module 160. The second voltage switch circuit module 160 comprises $2^N$ voltage switch circuits. The output terminals of the $2^N$ voltage switch circuits are connected to the $2^N$ array bus signal lines Array_bus<$2^N$−1:0>, respectively. The second voltage switch circuit module 160 is controlled according to the N-bit address signal A<N−1:0> and a read signal Read. The operations will be illustrated in more details as follows.

Take the ($2^N$−1)-th array bus signal line Array_bus[$2^N$−1] for example. In a case that the ($2^N$−1)-th array bus signal line Array_bus[$2^N$−1] is controlled by the decoding unit 140 to be turned on, the voltage at the ($2^N$−1)-th array bus signal line Array_bus[$2^N$−1] is the input voltage VPP. Meanwhile, the second voltage switch circuit module 160 is connected to the ($2^N$−1)-th array bus signal line Array_bus[$2^N$−1] in a floating state. Whereas, in a case that the ($2^N$−1)-th array bus signal line Array_bus[$2^N$−1] is controlled by the decoding unit to be turned off, the voltage at the ($2^N$−1)-th array bus signal line Array_bus[$2^N$−1] is provided by the second voltage switch circuit module 160. According to the N-bit address signal A<N−1:0> and a read signal Read, the second voltage switch circuit module 160 may provide 0V or a read voltage VR to the ($2^N$−1)-th array bus signal line Array_bus[$2^N$−1]. The operations of other array bus signal lines are similar, and are not redundantly described herein.

In a logic circuit manufacturing process, the voltage magnitude that is two times to three times the logic level voltage may be considered as a high voltage. For example, if the logic level voltage is 2.5V, the voltage higher than 7V may be considered as a high voltage. If the logic level voltage is 3.3V, the voltage higher than 9 may be considered as a high voltage. Whereas, if the logic level voltage is 5V, the voltage higher than 18V may be considered as a high voltage.

For example, in the decoding circuit module of the memory of FIG. 1, the logic level voltage is 5V, the first voltage HV is 18V, and the second voltage MV is 10V. That is, in the HV decoding switch system 110, the voltage switch circuit 120 and the first voltage switch circuit module 130 are both connected to the high voltage (i.e. the first voltage HV). Similarly, the high voltage (i.e. the first voltage HV) is received by the voltage switch circuits of the second voltage switch circuit module 160 in a specified situation.

Generally, a high voltage may be received by the logic circuit during operations. Since the high-voltage-receiving logic circuit is not compatible with the conventional logic circuit manufacturing process, the high-voltage-receiving logic circuit needs to be produced by a special logic circuit manufacturing process. Under this circumstance, the circuitry complexity of the logic circuit and the fabricating cost thereof are both increased. In other words, since the voltage switch circuit of FIG. 1 fails to be produced by the existing logic circuit manufacturing process, the voltage switch circuit needs to be produced by a special circuit manufacturing process and the fabricating cost is increased.

Therefore, there is a need of providing a voltage switch circuit which is produced by a logic circuit manufacturing process.

SUMMARY OF THE INVENTION

The present invention provides a voltage switch circuit. The voltage switch circuit has lightly-doped PMOS transistors for withstanding high voltage stress. The lightly-doped PMOS transistors are compatible with a logic circuit manufacturing process. Consequently, the voltage switch circuit may be produced by a logic circuit manufacturing process.

A first embodiment of the present invention provides a voltage switch circuit. The voltage switch circuit includes an output circuit, a first voltage-drop controlling circuit, a second voltage-drop controlling circuit, a third voltage-drop controlling circuit, and an input circuit. The output circuit includes a first PMOS transistor and a second PMOS transistor. The first PMOS transistor has a source terminal and a body terminal connected to a high voltage source, a drain terminal connected to an inverted output terminal of the voltage switch circuit, and a gate terminal connected to an output terminal of the voltage switch circuit. The second PMOS transistor has a source terminal and a body terminal connected to the high voltage source, a drain terminal connected to the output terminal of the voltage switch circuit, and a gate terminal connected to the inverted output terminal of the voltage switch circuit. The first voltage-drop controlling circuit includes a third PMOS transistor and a fourth PMOS transistor. The third PMOS transistor has a body terminal connected to the high voltage source, a source terminal connected to the inverted output terminal, a drain terminal connected to a node e, and a gate terminal connected to a reference voltage source. The fourth PMOS transistor has a body terminal connected to the high voltage source, a source terminal connected to the output terminal, a drain terminal connected to a node f, and a gate terminal connected to the reference voltage source. The second voltage-drop controlling circuit includes a first NMOS transistor, a second NMOS transistor, a first bias voltage controlling circuit, and a second bias voltage controlling circuit. The first NMOS transistor has a drain terminal connected to the node e and a control terminal of the first bias voltage controlling circuit, a gate terminal connected to an output terminal of the first bias voltage controlling circuit, and a body terminal and a source terminal connected to a node c. The second NMOS transistor has a drain terminal connected to the node f and a control terminal of the second bias voltage controlling circuit, a gate terminal connected to an output terminal of the second bias voltage controlling circuit, and a body terminal and a source terminal connected to a node d. The third voltage-drop controlling circuit includes a third NMOS transistor and a fourth NMOS transistor. The third NMOS transistor has a drain terminal connected to the node c, a gate terminal connected to a logic voltage source, and a body terminal and a source terminal connected to a node a, wherein the fourth NMOS transistor has drain terminal connected to the node d, a gate terminal connected to the logic voltage source, and a body terminal and a source terminal connected to a node b. The input circuit includes a fifth NMOS transistor, a sixth NMOS transistor, a third bias voltage controlling circuit, and a fourth bias voltage controlling circuit. The fifth NMOS transistor has a drain terminal connected to the node a and an output terminal of the third bias voltage controlling circuit, a gate terminal connected to an input terminal of the voltage switch circuit, and a body terminal and a source terminal connected to a ground terminal. The sixth NMOS transistor has a drain terminal connected to the node b and an output terminal of the fourth bias voltage controlling circuit, a gate terminal connected to an inverted input terminal of the voltage switch circuit, and a body terminal and a source terminal connected to the ground terminal.

A second embodiment of the present invention provides a voltage switch circuit. The voltage switch circuit includes a voltage switch circuit having an output terminal connected to an array bus signal line. The input voltage is selectively provided to the array bus signal line by a decoding unit. The voltage switch circuit includes a first NMOS transistor, a first bias voltage controlling circuit, a second NMOS transistor, a second bias voltage controlling circuit, and a third NMOS transistor. A drain terminal of the first NMOS transistor is connected to the output terminal of the voltage switch circuit, and a source terminal and a body terminal of the first NMOS transistor are connected to a node b. A control terminal of the first bias voltage controlling circuit is connected to the output terminal of the voltage switch circuit, an input terminal of the first bias voltage controlling circuit is connected to an input terminal of the voltage switch circuit, and an output terminal of the first bias voltage controlling circuit is connected to a gate terminal of the first NMOS transistor. In a first operating state, the node b is biased by the first bias voltage controlling circuit to have a reference voltage. A drain terminal of the second NMOS transistor is connected to the node b, a gate terminal of the second NMOS transistor connected to a logic voltage source, and a source terminal and a body terminal of the second NMOS transistor are connected to a node a. A control terminal of the second bias voltage controlling circuit is connected to the input terminal of the voltage switch circuit, an input terminal of the second bias voltage controlling circuit is selectively connected to the logic voltage source and a read voltage source, and an output terminal of the second bias voltage controlling circuit is connected to the node a. A drain terminal of the third NMOS transistor is connected to the node a, a gate terminal of the third NMOS transistor is connected to the input terminal of the voltage switch circuit, and a source terminal and a body terminal of the third NMOS transistor are connected to a ground terminal.

A third embodiment of the present invention provides a voltage switch circuit. The voltage switch circuit includes a first voltage-drop path with a node a and a second voltage-drop path with a node b. The voltage switch circuit further includes an output circuit, a plurality of voltage-drop controlling circuits, and an input circuit. The output circuit is connected to a high voltage source, wherein the output circuit comprises a first output terminal connected to the first voltage-drop path and a second output terminal connected to the second voltage-drop path. The plurality of voltage-drop controlling circuits are connected between the first output terminal and the node a and connected between the second output terminal and the node b. The input circuit is connected to the node a and the node b, and includes a first input terminal and a second input terminal. If a high logic voltage level is inputted into the first input terminal and a low logic level voltage is inputted into the second input terminal, a voltage of the node a is equal to a voltage of a ground terminal, a medium-level voltage is outputted from the first output terminal, the high logic level voltage is outputted from the node b, and a voltage outputted from the second output terminal is equal to the voltage magnitude of the high voltage source. The voltage magnitude of the high voltage source is higher than the medium-level voltage, and the medium-level voltage is higher than the high logic level voltage.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 3A is a schematic circuit diagram illustrating a voltage switch circuit according to another embodiment of the present invention; and FIGS. 3B~3D are schematic circuit diagrams illustrating the bias voltages of the voltage switch circuit of FIG. 3A in different operating states.

DETAILED DESCRIPTION OF PREFERRED EMBODIMENTS

As known, a lightly-doped PMOS transistor may be produced in a standard logic circuit manufacturing process by a semiconductor manufacturer. This lightly-doped PMOS transistor is capable of withstanding high voltage stress. In addition, the lightly-doped PMOS transistor is compatible with the standard logic circuit manufacturing process. The present invention provides a voltage switch circuit with a lightly-doped PMOS transistor. In other words, in the voltage switch circuit of the present invention, only the lightly-doped PMOS transistor is subject to high voltage stress but other transistors are not subject to high voltage stress.

Figure 2A:
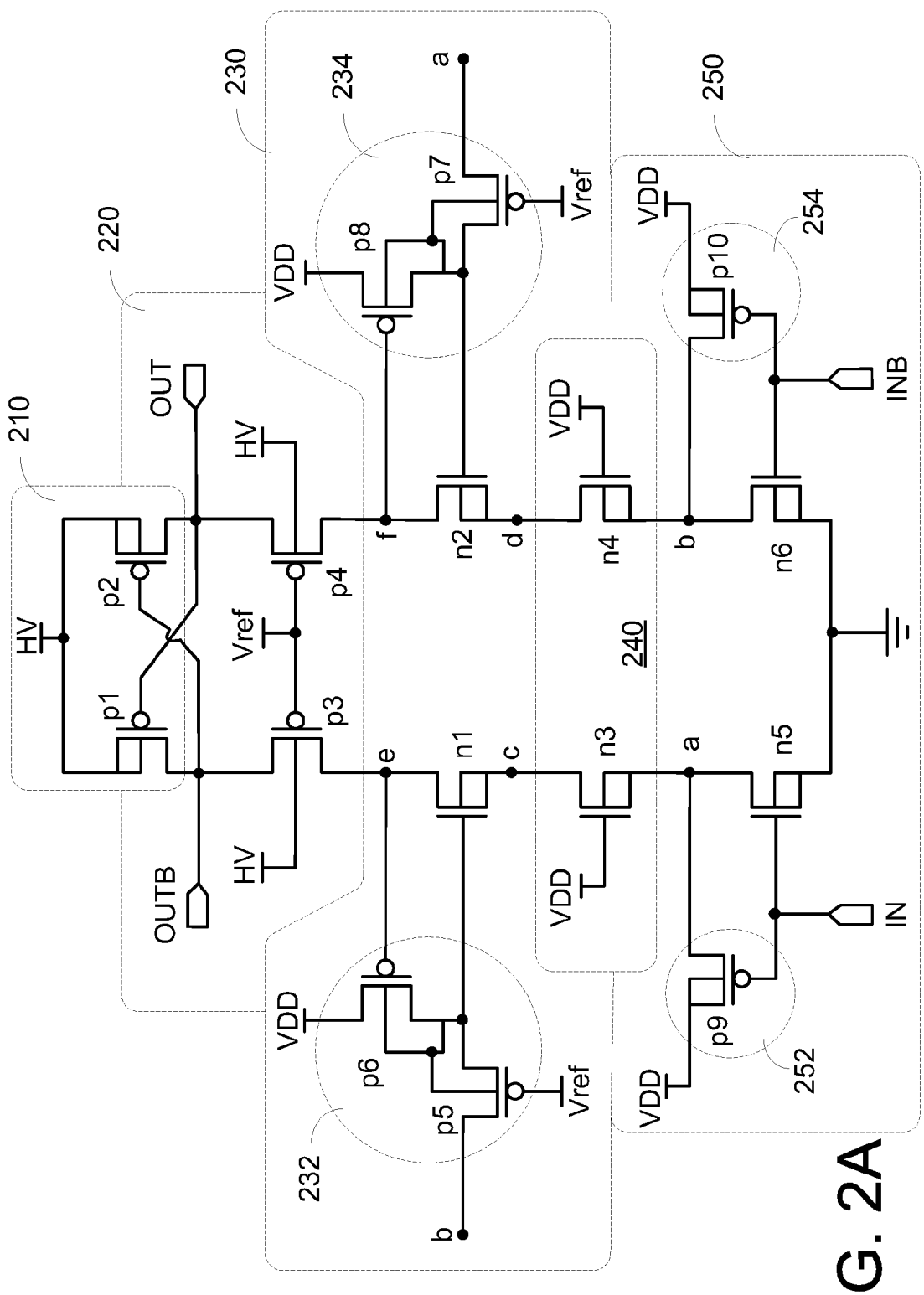
FIG. 2A is a schematic circuit diagram illustrating a voltage switch circuit according to an embodiment of the present invention.

FIG. 2A is a schematic circuit diagram illustrating a voltage switch circuit according to an embodiment of the present invention. As shown in FIG. 2A, the voltage switch circuit comprises an output circuit 210, a first voltage-drop controlling circuit 220, a second voltage-drop controlling circuit 230, a third voltage-drop controlling circuit 240, and an input circuit 250. In addition, the voltage magnitude of a high voltage source HV is higher than the voltage magnitude of a reference voltage source Vref, and the voltage magnitude of the reference voltage source Vref is higher than the voltage magnitude of a logic voltage source VDD.

The output circuit 210 comprises a first PMOS transistor pair. The first PMOS transistor pair comprises a first PMOS transistor p1 and a second PMOS transistor p2. In the first PMOS transistor p1, the source terminal and the body terminal are connected to the high voltage source HV, the drain terminal is connected to an inverted output terminal OUTB, and the gate terminal is connected to an output terminal OUT. In the second PMOS transistor p2, the source terminal and the body terminal are connected to the high voltage source HV, the drain terminal is connected to the output terminal OUT, and the gate terminal is connected to the inverted output terminal OUTB.

The first voltage-drop controlling circuit 220 comprises a second PMOS transistor pair. The second PMOS transistor pair comprises a third PMOS transistor p3 and a fourth PMOS transistor p4. In the third PMOS transistor p3, the body terminal is connected to the high voltage source HV, the source terminal is connected to the inverted output terminal OUTB, the drain terminal is connected to a node "e", and the gate terminal is connected to the reference voltage source Vref. In the fourth PMOS transistor p4, the body terminal is connected to the high voltage source HV, the source terminal is connected to the output terminal OUT, the drain terminal is connected to a node "f", and the gate terminal is connected to the reference voltage source Vref.

The second voltage-drop controlling circuit 230 comprises a first NMOS transistor pair, a first bias voltage controlling circuit 232, and a second bias voltage controlling circuit 234.

The first bias voltage controlling circuit 232 comprises a fifth PMOS transistor p5 and a sixth PMOS transistor p6. In the fifth PMOS transistor p5, the source terminal is served as an input terminal of the first bias voltage controlling circuit 232 and connected to a node "b", the gate terminal is connected to the reference voltage source Vref, and the body terminal and the drain terminal are connected with each other and served as an output terminal of the first bias voltage controlling circuit 232. In the sixth PMOS transistor p6, the source terminal is connected to the logic voltage source VDD, the gate terminal is served as a control terminal of the first bias voltage controlling circuit 232 and connected to the node "e", and the body terminal and the drain terminal are connected with each other and connected to the output terminal of the first bias voltage controlling circuit 232.

The second bias voltage controlling circuit 234 comprises a seventh PMOS transistor p7 and an eighth PMOS transistor p8. In the seventh PMOS transistor p7, the source terminal is served as an input terminal of the second bias voltage controlling circuit 234 and connected to a node "a", the gate terminal is connected to the reference voltage source Vref, and the body terminal and the drain terminal are connected with each other and served as an output terminal of the second bias voltage controlling circuit 234. In the eighth PMOS transistor p8, the source terminal is connected to the logic voltage source VDD, the gate terminal is served as a control terminal of the second bias voltage controlling circuit 234 and connected to the node "f", and the body terminal and the drain terminal are connected with each other and connected to the output terminal of the second bias voltage controlling circuit 234.

The first NMOS transistor pair comprises a first NMOS transistor n1 and a second NMOS transistor n2. In the first NMOS transistor n1, the drain terminal is connected to the node "e" and the control terminal of the first bias voltage controlling circuit 232, the gate terminal is connected to the output terminal of the first bias voltage controlling circuit 232, and the body terminal and the source terminal are connected to a node "c". In the second NMOS transistor n2, the drain terminal is connected to the node "f" and the control terminal of the second bias voltage controlling circuit 234, the gate terminal is connected to the output terminal of the second bias voltage controlling circuit 234, and the body terminal and the source terminal are connected to a node "d".

The third voltage-drop controlling circuit 240 comprises a second NMOS transistor pair. The second NMOS transistor pair comprises a third NMOS transistor n3 and a fourth NMOS transistor n4. In the third NMOS transistor n3, the drain terminal is connected to the node "c", the gate terminal is connected to the logic voltage source VDD, and the body terminal and the source terminal are connected to a node "a". In the fourth NMOS transistor n4, the drain terminal is connected to the node "d", the gate terminal is connected to the logic voltage source VDD, and the body terminal and the source terminal are connected to a node "b".

The input circuit 250 comprises a third NMOS pair, a third bias voltage controlling circuit 252, and a fourth bias voltage controlling circuit 254.

The third bias voltage controlling circuit 252 comprises a ninth PMOS transistor p9. In the ninth PMOS transistor p9, the source terminal and the body terminal are served as the input terminal of the third bias voltage controlling circuit 252 and connected to the logic voltage source VDD, the gate terminal is served as the control terminal of the third bias voltage controlling circuit 252 and connected to an input terminal IN, and the drain terminal is served as the output terminal of the third bias voltage controlling circuit 252 and connected to the node "a".

The fourth bias voltage controlling circuit 254 comprises a tenth PMOS transistor p10. In the tenth PMOS transistor p10, the source terminal and the body terminal are served as the input terminal of the fourth bias voltage controlling circuit 254 and connected to the logic voltage source VDD, the gate terminal is served as the control terminal of the fourth bias voltage controlling circuit 254 and connected to an inverted input terminal INB, and the drain terminal is served as the output terminal of the fourth bias voltage controlling circuit 254 and connected to the node "b".

The third NMOS transistor pair comprises a fifth NMOS transistor n5 and a sixth NMOS transistor n6. In the fifth NMOS transistor n5, the drain terminal is connected to the node "a" and the output terminal of the third bias voltage controlling circuit 252, the gate terminal is connected to the input terminal IN, and the body terminal and the source terminal are connected to the ground terminal. In the sixth NMOS transistor n6, the drain terminal is connected to the node "b" and the output terminal of the fourth bias voltage controlling circuit 254, the gate terminal is connected to the inverted input terminal INB, and the body terminal and the source terminal are connected to a ground terminal.

Figure 2B:
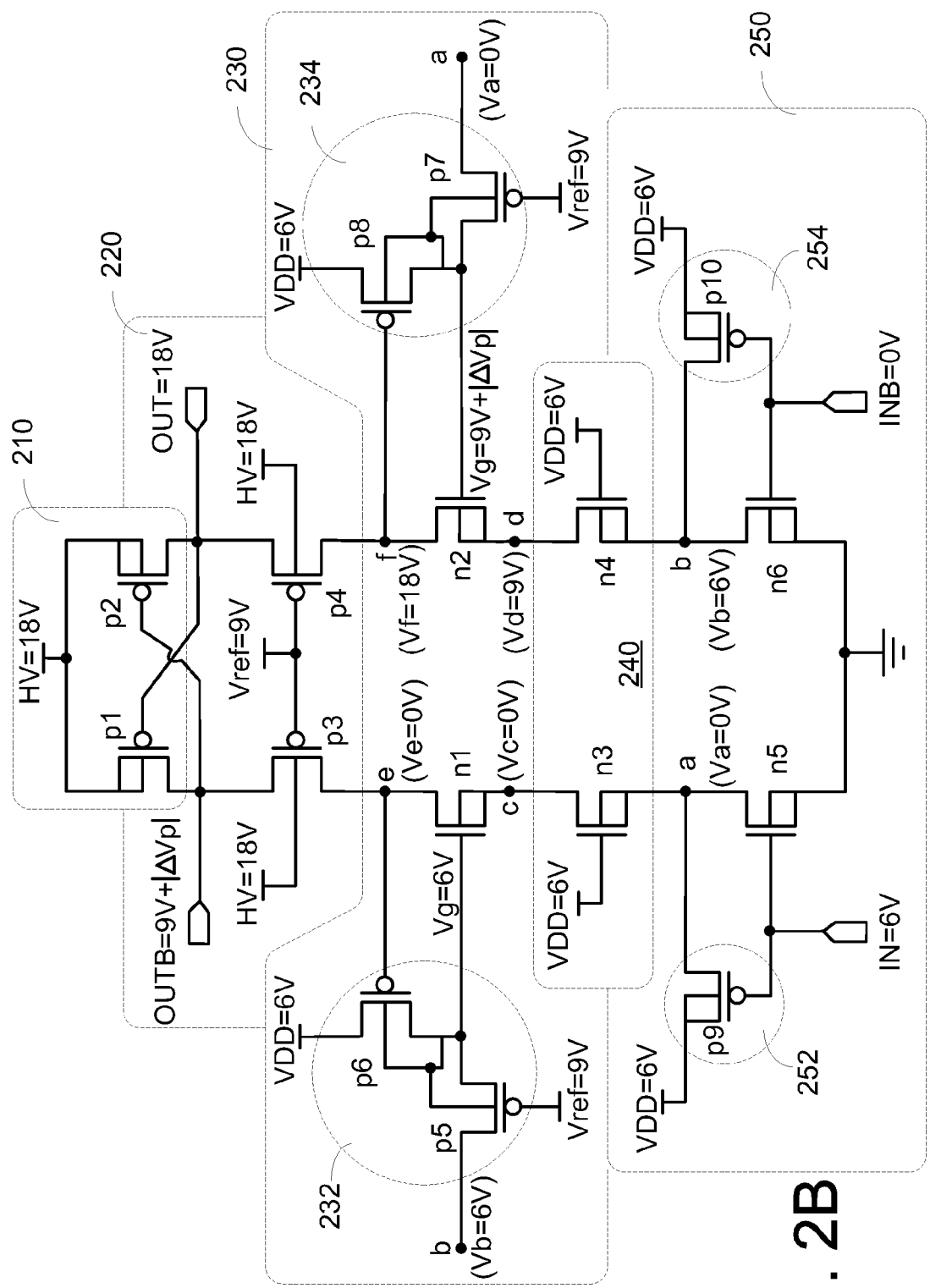
FIG. 2B is a schematic circuit diagram illustrating the bias voltages of the voltage switch circuit of FIG. 2A.

FIG. 2B is a schematic circuit diagram illustrating the bias voltages of the voltage switch circuit of FIG. 2A. As shown in FIG. 2B, the voltage magnitude of the high voltage source HV is 18V, the voltage magnitude of the reference voltage source is 9V, and the voltage magnitude of the logic voltage source VDD is 6V. A voltage-drop path is defined from the inverted output terminal OUTB to the ground terminal. In addition, another voltage-drop path is defined from the output terminal OUT to the ground terminal. The operations of the voltage-drop paths will be illustrated in more details as follows.

In a case that a high logic level voltage (6V) is inputted into the input terminal IN and a low logic level voltage (0V) is inputted into the inverted input terminal INB, the third bias voltage controlling circuit 252 of the input circuit is inactivated, the fourth bias voltage controlling circuit 254 of the input circuit is activated, the fifth NMOS transistor n5 is turned on, and the sixth NMOS transistor n6 is turned off. Under this circumstance, the voltage at the node "a" is 0V (i.e. Va=0V), and the voltage at the node "b" is 6V (i.e. Vb=6V).

Since the voltage at the node "a" is 0V (i.e. Va=0V) and the voltage at the node "b" is 6V (i.e. Vb=6V), the third NMOS transistor n3 of the third voltage-drop controlling circuit 240 is turned on and the fourth NMOS transistor n4 of the third voltage-drop controlling circuit 240 is turned off. Under this circumstance, the voltage at the node "c" is 0V (i.e. Vc=0V), and the voltage at the node "d" (Vd) is determined by the second voltage-drop controlling circuit 230.

Moreover, since the voltage at the node "b" is 6V (i.e. Vb=6V) and the voltage at the node "c" is 0V (i.e. Vc=0V), the sixth PMOS transistor p6 is turned on and the fifth PMOS transistor p5 is turned off. Under this circumstance, the output terminal of the first bias voltage controlling circuit 232 of the second voltage-drop controlling circuit 230 will output a voltage (6V) to the gate terminal of the first NMOS transistor n1 (i.e. Vg=6V). As a consequence, the first NMOS transistor n1 is turned on, the voltage at the node "e" is 0V (i.e. Ve=0V).

Since the voltage at the node "e" is 0V (i.e. Ve=0V) and the gate terminals of the third PMOS transistor p3 and the fourth PMOS transistor p4 of the first voltage-drop controlling circuit 220 are connected to the reference voltage source Vref (9V), the voltage at the inverted output terminal OUTB (i.e. the source voltage of the third PMOS transistor p3) is equal to 9V+|ΔVp|, wherein ΔVp is the threshold voltage of the PMOS transistor p3.

Since the voltage at the inverted output terminal OUTB is equal to 9V+|ΔVp|, the second PMOS p2 is turned on, the voltage at the output terminal is equal to the voltage magnitude of the high voltage source HV (18V), and the first PMOS transistor p1 is turned off.

Since the voltage at the output terminal is 18V, the fourth PMOS transistor p4 of the first voltage-drop controlling circuit 220 is turned on, and the voltage at the node "f" is 18V (i.e. Vf=18V).

Since the voltage at the node "f" is 18V (i.e. Vf=18V) and the voltage at the node "a" is 0V (i.e. Va=0), the eighth PMOS transistor p8 of the second bias voltage controlling circuit 234 is turned off. Under this circumstance, the output terminal of the second bias voltage controlling circuit 234 issues a voltage (9V+|ΔVp|) to the gate terminal of the second NMOS transistor n2 (i.e. Vg=9V+|ΔVp|). Meanwhile, the voltage at the node "d" is maintained at 9V (i.e. Vd=9V).

As shown in FIGS. 2A and 2B, the voltage switch circuit is bilaterally symmetrical. Consequently, the low logic level voltage (0V) is inputted into the input terminal IN and the high logic level voltage (6V) is inputted into the inverted input terminal INB, the operations are similar to those described above. Under this circumstance, the voltage at the output terminal OUT is equal to 9V+|ΔVp|, and the voltage at the inverted output terminal OUTB is equal to 18V.

Assuming that the threshold voltage ΔVp of the PMOS is −1V, if the high logic level voltage (6V) is inputted into the input terminal IN, the voltage at the output terminal OUT is equal to the voltage magnitude of the high voltage source HV (e.g. 18V). Whereas, if the low logic level voltage (0V) is inputted into the input terminal IN, the voltage at the output terminal OUT is equal to 10V.

Alternatively, in some embodiments, the input terminal IN and the inverted input terminal INB may be interchanged with each other. Consequently, if the low logic level voltage (0V) is inputted into the input terminal IN, the voltage at the output terminal OUT is equal to the voltage magnitude of the high voltage source HV (e.g. 18V). Whereas, if the high logic level voltage (6V) is inputted into the input terminal IN, the voltage at the output terminal OUT is equal to 10V.

Alternatively, in some embodiments, the output terminal OUT and the inverted output terminal OUTB may be interchanged with each other. Consequently, if the low logic level voltage (0V) is inputted into the input terminal IN, the voltage at the output terminal OUT is equal to the voltage magnitude of the high voltage source HV (e.g. 18V). Whereas, if the high logic level voltage (6V) is inputted into the input terminal IN, the voltage at the output terminal OUT is equal to 10V.

From the bias voltages of the voltage switch circuit, it is found that the PMOS transistors p1~p8 can withstand high voltage stress in some specified situations. Consequently, the PMOS transistors p1~p8 may be implemented by lightly-doped PMOS transistors, which are compatible to the standard logic circuit manufacturing process. Since the voltage switch circuit of the present invention may be fabricated by the logic circuit manufacturing process, the fabricating cost is reduced and the circuitry complexity is simplified.

Figure 1:
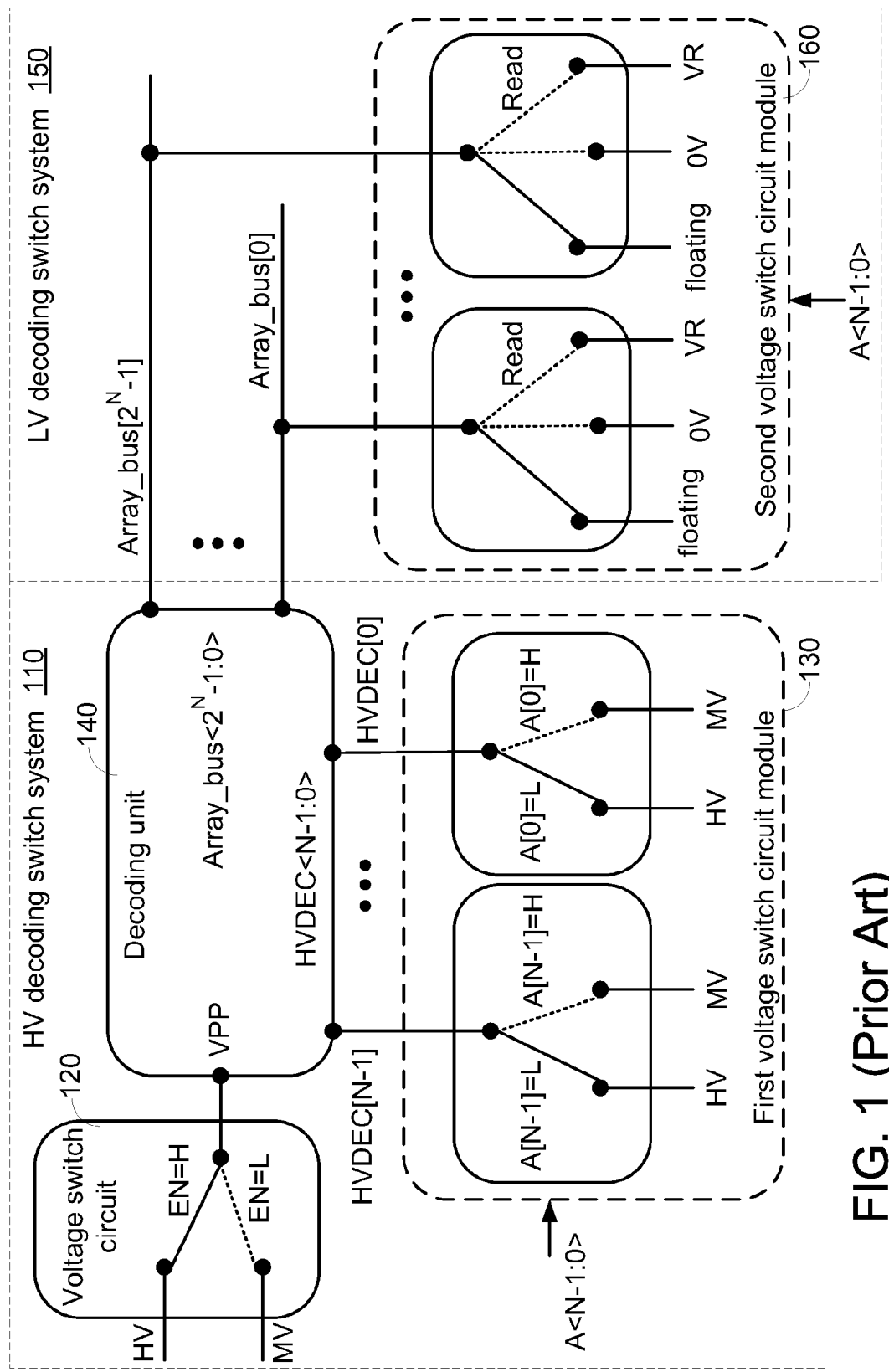
FIG. 1 (prior art) is a schematic circuit diagram illustrating a decoding circuit module for a memory according to the prior art.

The bias voltage controlling circuit of the present invention may be applied to the circuit switch circuit of the conventional second voltage switch circuit module as shown in FIG. 1. FIG. 3A is a schematic circuit diagram illustrating a voltage switch circuit according to another embodiment of the present invention. As shown in FIG. 3A, an output terminal OUT of the voltage switch circuit is connected to an array bus signal line (Array_bus). In addition, an input voltage VPP is selectively provided to the output terminal OUT of the voltage switch circuit by a decoding unit 340.

As shown in FIG. 3A, the voltage switch circuit comprises a first NMOS transistor n1, a second NMOS transistor n2, a third NMOS transistor n3, a first bias voltage controlling circuit 310, and a second bias voltage controlling circuit 320.

The first bias voltage controlling circuit 310 comprises a first PMOS transistor p1 and a second PMOS transistor p2. In the first PMOS transistor p1, the source terminal is served as the input terminal of the first bias voltage controlling circuit 310 and connected to an input voltage IN of the voltage switch circuit, the gate terminal is connected to a reference voltage source Vref, and the body terminal and the drain terminal are connected with each other and served as the output voltage of the first bias voltage controlling circuit 310. In the second PMOS transistor p2, the source terminal is connected to a logic voltage source VDD, the gate terminal is served as the control terminal of the first bias voltage controlling circuit 310 and connected to an output terminal OUT of the voltage switch circuit, and the body terminal and the drain terminal are connected with each other and connected to the output voltage of the first bias voltage controlling circuit 310.

In the first NMOS transistor n1, the drain terminal is connected to the output terminal OUT of the voltage switch circuit, the gate terminal is connected to the output terminal of the first bias voltage controlling circuit 310, and the source terminal and the body terminal are connected to a node "b".

In the second NMOS transistor n2, the drain terminal is connected to the node "b", the gate terminal is connected to the logic voltage source VDD, and the source terminal and the body terminal are connected to a node "a".

The second bias voltage controlling circuit 320 comprises a third PMOS transistor p3. In the third PMOS transistor p3, the source terminal and the body terminal are served as the input terminal of the second bias voltage controlling circuit 320 and selectively connected to the logic voltage source VDD or a read voltage source VR, the gate terminal is served as the control terminal of the second bias voltage controlling circuit 320 and connected to the input voltage IN of the voltage switch circuit, and the drain terminal is served as the output terminal of the second bias voltage controlling circuit 320 and connected to the node "a".

In the third NMOS transistor n3, the drain terminal is connected to the node "a", the gate terminal is connected to the input voltage IN of the voltage switch circuit, and the source terminal and the body terminal are connected to a ground terminal.

Figure 3D:
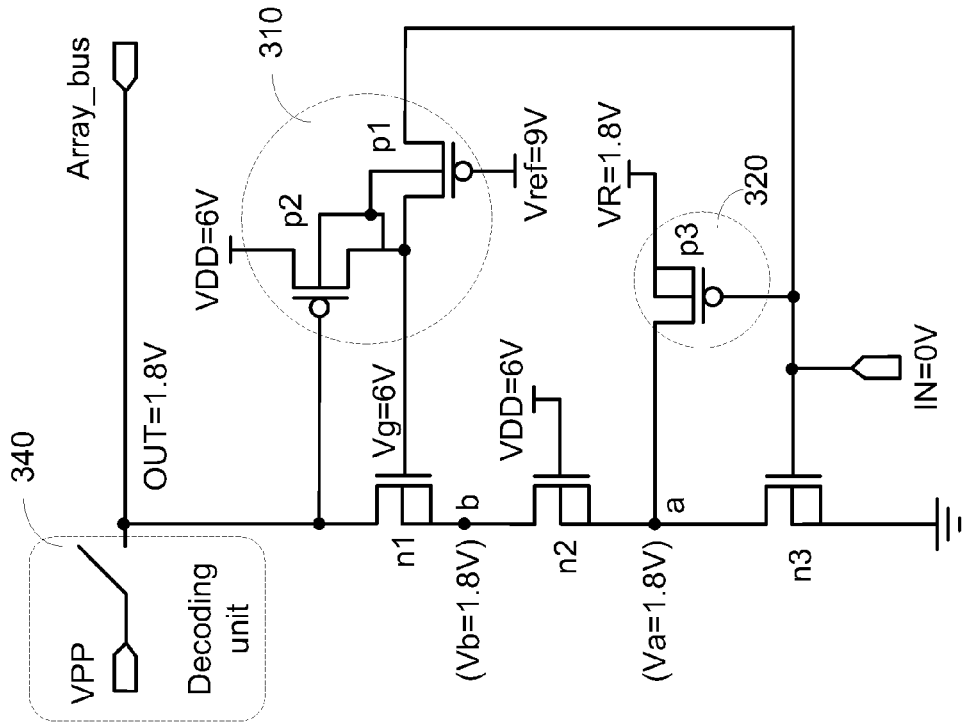
Figure 3C:
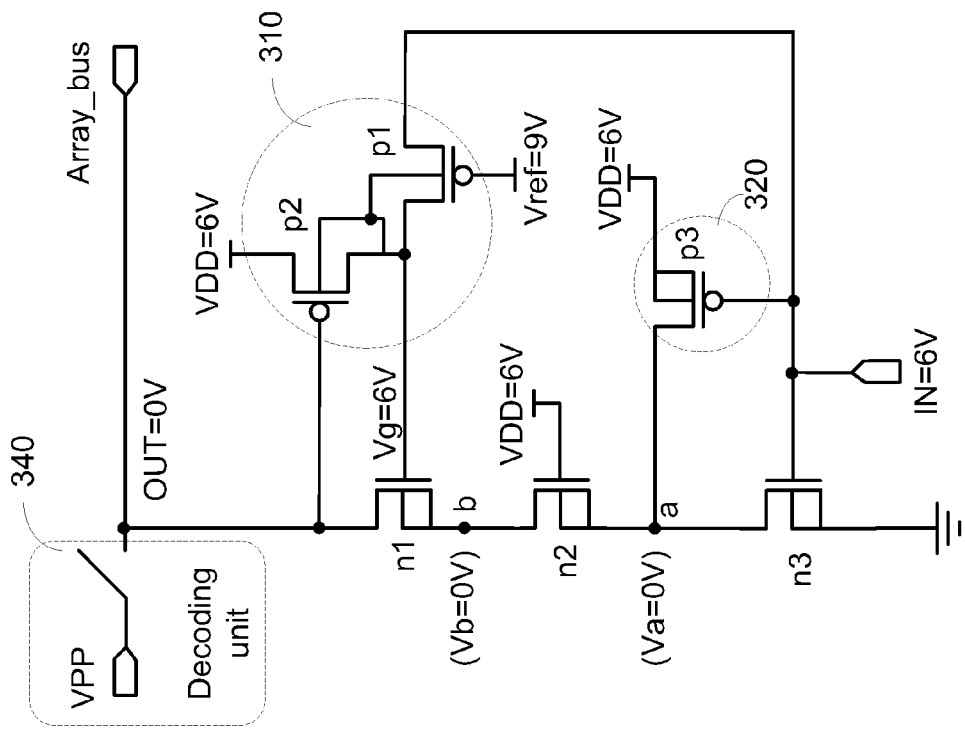

FIGS. 3B~3D are schematic circuit diagrams illustrating the bias voltages of the voltage switch circuit of FIG. 3A in different operating states. The input voltage VPP provided by the decoding unit 340 is 18V, the voltage magnitude of the reference voltage source Vref is 9V, the voltage magnitude of the logic voltage source VDD is 6V, and the voltage magnitude of the read voltage source VR is 1.8V. The operations will be illustrated in more details as follows.

Please refer to FIG. 3B. In a first operating state, the input voltage VPP (e.g. 18V) is provided to the output terminal OUT of the voltage switch circuit by the decoding unit 340, and a low logic level voltage (0V) is inputted into the input terminal IN. Under this circumstance, the second bias voltage controlling circuit 320 is activated, the third NMOS transistor n3 is turned off, and the voltage at the node "a" is 6V (e.g. Va=6V).

Since the voltage at the node "a" is 6V (e.g. Va=6V) and the gate terminal of the second NMOS transistor n2 is connected to the logic voltage source VDD (e.g. 6V), the second NMOS transistor n2 is turned off and the voltage at the node "b" (Vb) is determined according to a bias voltage of the first NMOS transistor n1.

Since the voltage at the output terminal OUT of the voltage switch circuit is 18V (i.e. OUT=18V) and a low logic level voltage (0V) is inputted into the input terminal IN (i.e. IN=0V), the second PMOS transistor p2 of the first bias voltage controlling circuit 310 is turned off. Under this circumstance, the output terminal of the first bias voltage controlling circuit 310 issues a voltage (9V+|ΔVp|) to the gate terminal of the first NMOS transistor n1 (i.e. Vg=9V+|ΔVp|). Meanwhile, the voltage at the node "b" is maintained at 9V (i.e. Vb=9V).

Please refer to FIG. 3C. In a second operating state, the input voltage VPP (e.g. 18V) is not provided to the output terminal OUT of the voltage switch circuit by the decoding unit 340, and a high logic level voltage (6V) is inputted into the input terminal IN. Under this circumstance, the second bias voltage controlling circuit 320 is inactivated, the third NMOS transistor n3 is turned on, and the voltage at the node "a" is 0V (e.g. Va=0V).

Since the voltage at the node "a" is 0V (e.g. Va=0V), the second NMOS transistor n2 is turned on. Meanwhile, the voltage at the node "b" is 0V (i.e. Vb=0V).

Moreover, since the voltage at the node "b" is 0V (i.e. Vb=0V) and the high logic level voltage (6V) is inputted into the input terminal IN, the second PMOS transistor p2 is turned on and the first PMOS transistor p1 is turned off. Meanwhile, the output terminal of the first PMOS transistor p1 issues 6V to the gate terminal of the first NMOS transistor n1 (i.e. Vg=6V). Consequently, the first NMOS transistor n1 is turned on, and the voltage at the output terminal OUT of the voltage switch circuit is 0V (i.e. OUT=0V).

Please refer to FIG. 3D. In a third operating state, the input voltage VPP (e.g. 18V) is not provided to the output terminal OUT of the voltage switch circuit by the decoding unit 340, a low logic level voltage (0V) is inputted into the input terminal IN, and the input terminal of the second bias voltage controlling circuit 320 is connected to the read voltage source VR (e.g. 1.8V). Under this circumstance, the second bias voltage controlling circuit 320 is activated, and the third NMOS transistor n3 is turned off. Meanwhile, the voltage at the node "a" is 1.8V (i.e. Va=1.8V).

Since the voltage at the node "a" is 1.8V (i.e. Va=1.8V) and the gate terminal of the second NMOS transistor n2 is connected to the logic voltage source VDD (e.g. 6V), the second NMOS transistor n2 is turned on and the voltage at the node "b" is 1.8V (i.e. Vb=1.8V).

Moreover, since the voltage at the node "b" is 1.8V (i.e. Vb=1.8V) and low logic level voltage (0V) is inputted into the input terminal IN, the second PMOS transistor p2 is turned on and the first PMOS transistor p1 is turned off. Meanwhile, the output terminal of the first PMOS transistor p1 issues 6V to the gate terminal of the first NMOS transistor n1 (i.e. Vg=6V). Consequently, the first NMOS transistor n1 is turned on, and the voltage at the output terminal OUT of the voltage switch circuit is 1.8V (i.e. OUT=1.8V).

From the bias voltages of the voltage switch circuit as shown in FIGS. 3B~3D, it is found that the PMOS transistors p1~p2 can withstand high voltage stress in some specified situations. Consequently, the PMOS transistors p1~p2 may be implemented by lightly-doped PMOS transistors, which are compatible to the standard logic circuit manufacturing process. Since the voltage switch circuit of the present invention may be fabricated by the logic circuit manufacturing process, the fabricating cost is reduced and the circuitry complexity is simplified.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A voltage switch circuit having an output terminal connected to an array bus signal line, an input voltage being selectively provided to the array bus signal line by a decoding unit, the voltage switch circuit comprising:
   a first NMOS transistor, wherein a drain terminal of the first NMOS transistor is connected to the output terminal of the voltage switch circuit, and a source terminal and a body terminal of the first NMOS transistor are connected to a node b;
   a first bias voltage controlling circuit, wherein a control terminal of the first bias voltage controlling circuit is connected to the output terminal of the voltage switch circuit, an input terminal of the first bias voltage controlling circuit is connected to an input terminal of the voltage switch circuit, and an output terminal of the first bias voltage controlling circuit is connected to a gate terminal of the first NMOS transistor, wherein in a first operating state, the node b is biased by the first bias voltage controlling circuit to have a reference voltage;
   a second NMOS transistor, wherein a drain terminal of the second NMOS transistor is connected to the node b, a gate terminal of the second NMOS transistor connected to a logic voltage source, and a source terminal and a body terminal of the second NMOS transistor are connected to a node a;
   a second bias voltage controlling circuit, wherein a control terminal of the second bias voltage controlling circuit is connected to the input terminal of the voltage switch circuit, an input terminal of the second bias voltage controlling circuit is selectively connected to the logic voltage source and a read voltage source, and an output terminal of the second bias voltage controlling circuit is connected to the node a; and
   a third NMOS transistor, wherein a drain terminal of the third NMOS transistor is connected to the node a, a gate terminal of the third NMOS transistor is connected to the input terminal of the voltage switch circuit, and a source terminal and a body terminal of the third NMOS transistor are connected to a ground terminal.

2. The voltage switch circuit as claimed in claim 1, wherein the voltage magnitude of the input voltage from the decoding unit is higher than the voltage magnitude of the reference voltage, the voltage magnitude of the reference voltage is higher than the voltage magnitude of the logic voltage source, and the voltage magnitude of the logic voltage source is higher than the voltage magnitude of the read voltage source.

3. The voltage switch circuit as claimed in claim 1, wherein the voltage magnitude of the input voltage from the decoding unit is 18V, the voltage magnitude of the reference voltage is 9V, the voltage magnitude of the logic voltage source is 6V, and the voltage magnitude of the read voltage source is 1.8V.

4. The voltage switch circuit as claimed in claim 1, wherein the first bias voltage controlling circuit comprises a first PMOS transistor and a second PMOS transistor, wherein the first PMOS transistor has a source terminal serving as the input terminal of the first bias voltage controlling circuit and connected to the input voltage of the voltage switch circuit, a gate terminal connected to the reference voltage, and a body terminal and a drain terminal connected with each other and serving as the output of the first bias voltage controlling circuit, wherein the second PMOS transistor has a source terminal connected to the logic voltage source, a gate terminal serving as the control terminal of the first bias voltage controlling circuit and connected to the output terminal of the voltage switch circuit, and a body terminal and a drain terminal connected with each other and connected to the output of the first bias voltage controlling circuit.

5. The voltage switch circuit as claimed in claim 4, wherein the first PMOS transistor and the second PMOS transistor are lightly-doped PMOS transistors that withstand high voltage stress.

6. The voltage switch circuit as claimed in claim 1, wherein the second bias voltage controlling circuit comprises a third PMOS transistor, wherein the third PMOS transistor has a source terminal and a body terminal serving as the input terminal of the second bias voltage controlling circuit and selectively connected to the logic voltage source or the read voltage source, a gate terminal serving as the control terminal of the second bias voltage controlling circuit and connected to the input voltage of the voltage switch circuit, and a drain terminal serving as the output terminal of the second bias voltage controlling circuit and connected to the node a.

* * * * *